United States Patent [19]
Gimpelson et al.

[11] Patent Number: 4,666,737
[45] Date of Patent: May 19, 1987

[54] VIA METALLIZATION USING METAL FILLETS

[75] Inventors: George E. Gimpelson, Indialantic; Anthony L. Rivoli, Palm Bay; John T. Gasner, Melbourne; Elias W. George, Indian Harbor Beach, all of Fla.

[73] Assignee: Harris Corporation, Melbourne, Fla.

[21] Appl. No.: 828,186

[22] Filed: Feb. 11, 1986

[51] Int. Cl.⁴ .......................................... H01L 21/285
[52] U.S. Cl. ....................................... 427/89; 427/90; 427/91; 204/192.23; 156/643; 156/644
[58] Field of Search .................... 430/314; 427/89, 90, 427/91; 151/644, 643; 204/192 SP

[56] References Cited

U.S. PATENT DOCUMENTS

| | | |
|---|---|---|
| 3,756,875 | 9/1973 | Eccleston et al. |
| 4,234,362 | 11/1980 | Riseman |
| 4,255,514 | 3/1981 | Kane |
| 4,322,883 | 4/1982 | Abbas et al. |
| 4,378,627 | 4/1983 | Jambotkar |
| 4,415,606 | 11/1983 | Cynkar ............................ 427/90 |
| 4,448,636 | 5/1984 | Baber |
| 4,473,598 | 9/1984 | Ephrath ........................... 427/86 |
| 4,518,629 | 5/1985 | Jeuch .............................. 427/89 |
| 4,544,445 | 10/1985 | Jeuch .............................. 427/88 |
| 4,592,802 | 6/1986 | Deleonibus ....................... 427/90 |

FOREIGN PATENT DOCUMENTS 56-87666 7/1981 Japan ................................ 156/644

OTHER PUBLICATIONS

Defense Publication T 101,201, Issued Nov. 3, 1981 by Anantha et al.

*Primary Examiner*—John D. Smith
*Attorney, Agent, or Firm*—Barnes & Thornburg

[57] ABSTRACT

A method is provided for semiconductor manufacture wherein a via is defined and etched through an insulative layer of the device to an underlying conductive region and metal fillets are formed in the corner regions of the via. A conformal metal layer is then deposited onto the device and etched until all metal is removed from the insulative layer surface. Finally, a second metal interconnect layer is deposited onto the device and the desired interconnect pattern is defined. The fillets displace the metal subsequently deposited on the via side surface laterally toward the center of the via, thereby preventing severe self-shadowing problems and improving step coverage of metal into the via.

18 Claims, 7 Drawing Figures

VIA METALLIZATION USING METAL FILLETS

BACKGROUND AND SUMMARY OF THE INVENTION

The present invention relates generally to a method for metallizing deep vias in an insulative layer surface.

In the manufacture of semiconductor devices, metal conductive layers are patterned for the purpose of making interconnections between different points on the device. After formation of this patterned metal conductive layer, an electrically insulative material such as silicon dioxide or silicon nitride is deposited over the metal conductive layer by conventional deposition techniques. The surface of this electrically insulative layer will routinely be uneven due to the uneven underlying contour of the patterned conductive layer. The presence of a metal interconnective path beneath the insulative layer results in a corresponding elevated path in the surface contour of the insulative layer.

Often it is necessary, especially in high density devices, to form additional patterned conductive layers on the surface of the uneven insulative layer. In order to interconnect the metal conductive layers to each other and to the substrate, the generally followed practice is to etch holes in the insulative layer prior to deposition of a metallic layer onto the insulative layer. These holes or vias are located in positions where contacts are desired between conductive regions such as previously deposited patterned metal layers or conductive substrate layers underlying the insulative layer and metal patterns deposited on the insulative layer. Vias are typically formed by applying a resist mask to the insulative layer. The resist mask contains openings where via holes are to be etched into the insulative layer. An etchant is then applied to the mask layer such that via holes are etched where openings occur in the etching mask. The etching mask is then removed from the surface of the insulative layer and a metal layer is deposited onto the insulative layer.

Presently, poor step coverage of the metal conductive layer into deep vias represents a severe restriction which limits multi-level interconnect technologies. Traditional deposition techniques often result in thinning of the conductive layer around the interior walls of the via and produce discontinuities between metal deposited in the bottom of the via and metal deposited on the surface of the insulative layer. Such thinning and discontinuities result in long-range reliability problems and reduced yields.

Prior art methods for reducing the severity of these deep via metallization problems include bevelling of via edges and increasing the thickness of deposited metal layers. However, bevelled edges on deep vias tend to decrease packing density and the thickness of the metal layer is limited due to capacitance and topography considerations. The deposition of thicker metal layers is also of limited use due to the occurrence of self-shadowing. Self-shadowing is a phenomenon occurring during deposition of thick metal layers whereby access to a via is effectively prevented by narrowing of the upper portion of the via adjacent the surface of the insulative layer prior to complete filling of the lower regions of the via. This phenomenon prevents metal from being deposited on the lower sidewall of deep vias.

It is therefore an object of the present invention to provide an improved method for metallizing deep vias.

It is another object of the invention to reduce step coverage problems through the provision of metal fillets.

These and other objects of the present invention are attained by the provision of a method comprising defining and etching vias through the insulative layer to an underlying conductive region, forming metal fillets in the corners of the deep vias, depositing a conformal metal layer, etching the metal layer until all metal has been removed from the substrate surface and depositing a second metal interconnect layer and defining the desired pattern.

Fillets can be formed by first depositing a metal etch stop layer if needed to prevent damage or etching of the underlying conductive region to which contact will be made. A partially conformal layer of interconnect metal is then deposited. The metal layer is etched anisotropically until all but the via sidewalls are clear of metal. The fillets on the sidewalls displace metal subsequently deposited on the side of the vias laterally toward the center of the via, thereby preventing severe self-shadowing and thus improving the step coverage of the metal into the via.

Larger vias can also be utilized due to the formation of fillets on the via sidewalls making the step into the via more gradual and thus more receptive to subsequent metallization steps.

In an alternative embodiment, the penultimate etching step is stopped before all metal is removed from the surface of the insulative layer, thus leaving a thin layer of metal on the insulative layer surface and in the bottom of the via. Since some deposited metals tend to exhibit enhanced electromigration resistance, this configuration improves the life time of the interconnect. Furthermore, where silicon is contacted in the bottom of the via, the thin metal layer remaining in the bottom of vias will also serve as a pitting or migration barrier.

Further objects, features, and advantages of the present invention will become more apparent from the following description when taken with the accompanying drawings which show, for purposes of illustration only, several embodiments in accordance with the present invention.

DETAILED DESCRIPTION OF THE DRAWINGS

Figure 1:
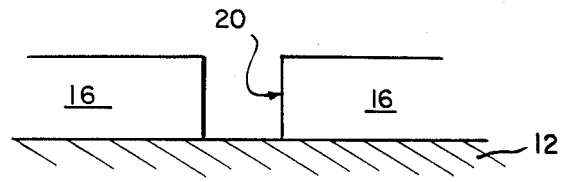
FIGS. 1 and 2 are sectional views of various stages in the prior art via metallization process.
Figure 2:
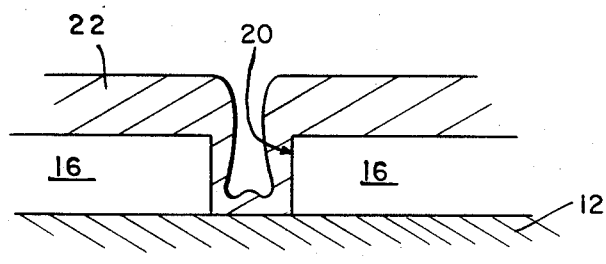

Referring to FIGS. 1 and 2, a method known in the prior art for semiconductor via metallization will be described.

Referring now in particular to FIG. 1, a conformal interlevel insulative layer 16 is deposited over a substrate 12. A via 20 is defined and etched through the insulative layer 16 to the underlying substrate 12.

Referring to FIG. 2, prior art methods for metallizing the via 20 require deposition of a first metal interconnect layer 22 upon the insulative layer 16 for the purpose of metallizing the via 20. Evident in FIG. 2 is the phenomenon referred to as self-shadowing. The build up of metal interconnect 22 adjacent the upper portion of via 20 effectively inhibits deposition of metal interconnect in the lower portion of the via 20, thereby resulting in incomplete via metallization.

The thin interconnect layer around the interior walls of the via results in long-range reliability problems and in the event of discontinuities between metal deposited in the bottom of a via and metal deposited on the surface of the insulative layer 16, a failure of the semiconductor device will occur.

The disadvantages of the prior art method are overcome by the method of the present invention wherein deep via metallization is effected.

Figure 3:
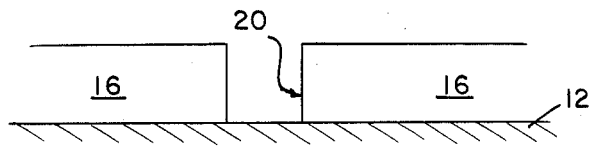
FIGS. 3–7 are sectional views of individual steps in the via metallization processes of the present invention.

Referring to FIGS. 3–7, the method of the present invention will be described. A typical semiconductor device suitable for treatment in accordance with the present invention is shown in FIG. 3. A conducting region 12 is covered by an insulating layer 16. The layer 12 may be formed from a variety of conductive metals such as aluminum, aluminum-copper, aluminum-silicon and aluminum-copper-silicon or other aluminum alloys or may be formed from silicon. Typically, the insulative layer 16 will be deposited silicon dioxide or silicon nitride film.

Figure 4:
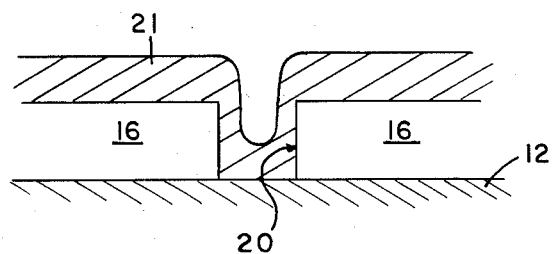

A via 20 is etched through the insulative layer 16 to underlying conductive region 12. Of course the underlying conductive region could be a previously deposited metal layer as well as a conductive substrate region or polysilicon or any other conducting or semiconducting material. Then as shown in FIG. 4, a layer of conformal or somewhat conformal conductive interconnect material 21 is deposited onto the surface of the insulative layer 16 and into the via 20. Preferably the layer of conformal interconnect material is deposited to a thickness of at least one-half the via diameter. Depending on the type of metal interconnect material used for the interconnect layer, it may be necessary to sputter a thin layer of metal onto the insulative surface and into the via 20 prior to deposition of the interconnect layer. This sputtered layer improves the adhesion of the subsequently deposited metal interconnect layer 21 and may subsequently act as an etch stop material. The interconnect material employed for metallization may be chosen from any one of a variety of conductive materials such as aluminum, aluminum alloys and tungsten. If tungsten is employed as the interconnect material, the thin sputtered layer used to improve adhesion may be composed of a material such as TiW.

Figure 5:
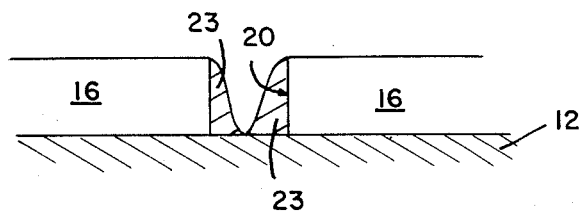

The conductive interconnect layer 21 is etched until the surfaces outside the via are clear, thereby leaving a fillet or plug 23 in the via 20 (as shown in FIG. 5). It is also possible to stop the etching process before all the interconnect material 21 is removed from the surface outside the via 20, thereby leaving a thin layer of interconnect material on the surface of the insulative layer 16 and in the bottom of the via 20 adjacent the substrate 12. This thin metal layer can exhibit enhanced eletromigration resistance so that the life time of subsequently deposited interconnect material will be improved. Furthermore, the thin metal layer remaining in the bottom of large vias can also serve as a pitting or migration barrier.

Figure 6:
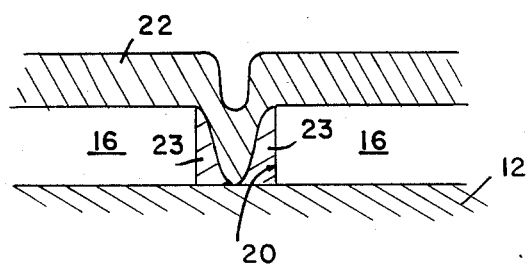

As shown in FIG. 6, a second metal interconnect layer 22 is deposited upon the composite structure of FIG. 5. The metal fillet 23 prevents deposition of newly deposited metal in the lower corners of the via and causes the newly deposited metal to collect in the control region of the via thereby preventing severe self-shadowing and thus improving the step coverage of metal 22 into the via 20.

Figure 7:
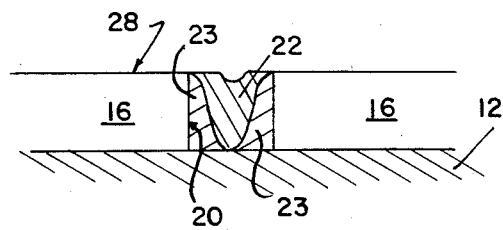

The prior art severe self-shadowing problem is not exhibited by a via treated in accordance with the present invention (see FIG. 7).

In accordance with the present invention, a semiconductor device having metallized vias may be manufactured advantageously as described in the following steps. In a first step, a conformal insulative layer having a thickness of approximately 0.7 micron is deposited over a first conductive layer using deposition techniques well known in the art. A via is etched through the insulative layer to the underlying conductive region which may comprise either a previously deposited patterned metal layer or a conductive substrate region. A 0.2 micron thick film of TiW is sputtered onto the insulative layer surface and into the vias for the purpose of improving adhesion of subsequently deposited interconnect material.

Next, a layer of conformal tungsten is chemically vapor deposited onto the semiconductor device. The tungsten layer is then etched, thereby leaving a fillet in the via. The tungsten layer may be etched by any of the well known prior art processes for metal etching such as plasma etching. Finally, the second metal interconnect material such as aluminum may be deposited onto the surface of the insulative layer and into the via containing the fillet. The desired pattern may then be formed in the interconnect material, or the interconnect material may be partially removed from the surface of the insulative layer by conventional methods and a pattern defined therein, or this interconnect layer can be completely removed as is FIG. 7 from the insulative layer surface 28, and a third interconnect layer can be deposited and defined in a desired pattern as required.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method for metallizing deep vias in a semiconductor surface comprising:

depositing a first layer of conductive material onto a surface of a layer of an insulative material having at least one hole therein leading to an underlying conductive region, thereby at least partially filling said hole with said conductive material;

etching at least a portion of said conductive layer, thereby forming a fillet in said hole; and depositing a second layer of conductive material into said hole, thereby substantially filling said hole.

2. A method according to claim 1, wherein said first conductive layer is completely removed from said surface of said insulative layer through etching.

3. A method according to claim 1, wherein a thin layer of metal is deposited onto said surface of said insulative material prior to deposition of said first layer of conductive material, thereby promoting adhesion of said layer of conductive material to said surface of said insulative material.

4. A method according to claim 3, wherein said metal is deposited in said hole on an inside surface of the hole.

5. A method according to claim 3, wherein said metal is deposited in said hole on a bottom surface of the hole.

6. A method according to claim 1, wherein said first layer serves as an etch stop.

7. A method according to claim 1, wherein said first layer of said conductive material comprises tungsten.

8. A method according to claim 1, wherein said etching is performed with a plasma etchant.

9. A method according to claim 1, wherein said insulative material is selected from a group consisting of silicon dioxide and silicon nitride.

10. A method according to claim 1, wherein said conductive material is selected from a group consisting of aluminum, alunimum-alloys and tungsten.

11. A method according to claim 1, wherein said first layer of conductive material is chemically vapor deposited onto said surface of said insulative material.

12. A method according to claim 3, wherein said metal comprises TiW.

13. A method according to claim 12, wherein said TiW is sputtered onto said insulative surface.

14. A method according to claim 3, wherein said metal is sputtered onto said insulative surface.

15. A method according to claim 1, wherein said hole comprises a via for connecting said second layer of conductive material to another layer of conductive material underlying said second layer of conductive material.

16. A method according to claim 1, wherein said second layer of conductive material is partially removed and a pattern formed thereon.

17. A method according to claim 1, wherein said second layer of conductive material is completely removed from said surface of said insulative layer and a third layer of conductive material deposited on said insulative layer.

18. A method according to claim 1, wherein said second layer is not removed from said hole.

* * * * *